(12) United States Patent  
Furuta et al.

(10) Patent No.: US 8,395,185 B2
(45) Date of Patent: Mar. 12, 2013

(54) SWITCHING ELEMENT (75) Inventors: Shigeo Furuta, Tsukuba (JP); Yuichiro Masuda, Tsukuba (JP); Tsuyoshi Takahashi, Tsukuba (JP); Masatoshi Ono, Tsukuba (JP); Yasuhisa Naitoh, Tsukuba (JP); Masayo Horikawa, Tsukuba (JP); Tetsuo Shimizu, Tsukuba (JP)

(73) Assignees: Funai Electric Advanced Applied Technology Research Institute Inc., Tsukuba-shi (JP); National Institute of Advanced Industrial Science and Technology, Tokyo (JP); Funai Electric Co., Ltd., Daito-shi (JP)

( * ) Notice: Subject to any disclaimer, the term of this patent is extended or adjusted under 35 U.S.C. 154(b) by 646 days.

(21) Appl. No.: 12/140,411

(22) Filed: Jun. 17, 2008

(65) Prior Publication Data

US 2008/0315184 A1 Dec. 25, 2008

(30) Foreign Application Priority Data

Jun. 22, 2007 (JP) ................................. 2007-165393

(51) Int. Cl.
*H01L 29/66* (2006.01)
(52) U.S. Cl. ................. 257/130; 257/270; 257/E51.003
(58) Field of Classification Search .................. 257/30, 257/130, 155, 109, 270, 507, E51.003, E51.008, 257/E51.025, E29.001, E45.002, E45.003, 257/E41.415

See application file for complete search history.

(56) References Cited

U.S. PATENT DOCUMENTS

| | | | |
|---|---|---|---|
| 5,736,758 A * | 4/1998 | Salisbury | 257/290 |
| 7,425,720 B2 * | 9/2008 | Kaeriyama et al. | 257/4 |
| 7,902,586 B2 * | 3/2011 | Naitoh et al. | 257/314 |
| 2002/0084736 A1 * | 7/2002 | Shibata | 313/310 |
| 2003/0186167 A1 * | 10/2003 | Johnson, Jr. et al. | 430/296 |
| 2006/0102927 A1 * | 5/2006 | Fujita et al. | 257/130 |
| 2006/0157802 A1 | 7/2006 | Sakamoto et al. | |
| 2008/0315184 A1 * | 12/2008 | Furuta et al. | 257/30 |
| 2009/0020742 A1 * | 1/2009 | Sunamura et al. | 257/4 |

FOREIGN PATENT DOCUMENTS

| | | |
|---|---|---|
| EP | 1 939 941 A1 | 7/2008 |
| JP | 2004-306208 A | 11/2004 |
| JP | 2005-79335 A | 3/2005 |
| JP | 2006-234799 A | 9/2006 |
| JP | 2007-123828 A | 5/2007 |
| WO | WO 03/028124 A1 | 4/2003 |
| WO | WO 2007/037210 A1 | 4/2007 |

OTHER PUBLICATIONS

Chinese Office Action dated Jun. 13, 2011 with English Translation (ten (10) pages).
First Office Action in Chinese Patent Application No. 200810125332.7 dated Nov. 23, 2010.
The Extended European Search Report dated Apr. 27, 2012 (Five (5) pages).

* cited by examiner

*Primary Examiner* — Cuong Q Nguyen
*Assistant Examiner* — Yosef Gebreyesus
(74) *Attorney, Agent, or Firm* — Crowell & Moring LLP

(57) ABSTRACT

A switching element comprising: an insulative substrate; a first electrode and a second electrode provided on one surface of the insulative substrate; and an interelectrode gap which is provided between the first electrode and the second electrode, and which has a gap on the order of nanometers in which switching phenomenon of resistance occurs by applying predetermined voltage between the first electrode and the second electrode, wherein the one surface of the insulative substrate contains nitrogen.

9 Claims, 8 Drawing Sheets

| CONDITION OF PLASMA NITRIDING PROCESSING | NITROGEN DETECTION AMOUNT [COUNT] | VOLTAGE VALUE CORRESPONDING TO PEAK OF DISTRIBUTION [V] |
|---|---|---|
| NITROGEN PRESSURE: 0.25 mbar<br>PLASMA FREQUENCY: 2.45 GHz<br>PROCESSING TIME: 1 HOUR | ABOUT 400 | 2.22 |
| NITROGEN PRESSURE: 1 mbar<br>PLASMA FREQUENCY: 2.45 GHz<br>PROCESSING TIME: 1 HOUR | ABOUT 250 | 2.56 |
| NITROGEN PRESSURE: 1 mbar<br>PLASMA FREQUENCY: 2.45 GHz<br>PROCESSING TIME: 6 HOUR | ABOUT 500 | 2.45 |

FIG.9

SWITCHING ELEMENT

BACKGROUND OF THE INVENTION

1. Field of the Invention

The present invention relates to a switching element.

2. Description of Related Art

As devices are reduced in size and densities are enhanced, it is now required to further miniaturize electric element. As one example, there is known a switching element capable of carrying out a switching operation by applying voltage between two electrodes (interelectrode nanogap) which are separated from each other by a fine gap.

More specifically, there is developed a switching element which is made of silicon oxide and gold, which are stable materials, by a simple producing method called shadow evaporation (inclined deposition). According to this switching element, switching operation can stably be repeated (see Japanese Patent Application Laid-open No. 2005-79335 for example).

In addition to the silicon oxide, an element using silicon nitride instead of silicon oxide is known. More specifically, there are MEMS (Micro Electron Mechanical Systems) element (see Japanese Patent Application Laid-open No. 2004-306208 for example) using a silicon nitride film as an insulating film, and a molecular element (see Japanese Patent Application Laid-open No. 2006-234799 for example) using a silicon nitride layer as an insulating layer. In these elements, the silicon nitride functions only as an insulator.

In the switching element of a patent document 1, it is required to further reduce operating voltage.

SUMMARY OF THE INVENTION

It is one of objects of the present invention to further reduce the operating voltage of the switching element.

To achieve the object, according to a first aspect of the invention, there is provided a switching element comprising: an insulative substrate; a first electrode and a second electrode both provided on one surface of the insulative substrate; and an interelectrode gap which is provided between the first electrode and the second electrode, and which has a gap on the order of nanometers in which switching phenomenon of resistance occurs by applying predetermined voltage between the first electrode and the second electrode, wherein the one surface of the insulative substrate contains nitrogen.

Preferably, the one surface of the insulative substrate is made of silicon oxide treated with predetermined nitriding processing.

Preferably, the predetermined nitriding processing is plasma nitriding processing.

Preferably, the one surface of the insulative substrate is made of silicon nitride.

According to a second aspect of the present invention, there is provided a switching element comprising: an insulative substrate; a first electrode and a second electrode provided on one surface of the insulative substrate; and an interelectrode gap which is provided between the first electrode and the second electrode, and which has a gap on the order of nanometers in which switching phenomenon of resistance occurs by applying predetermined voltage between the first electrode and the second electrode, wherein the one surface of the insulative substrate is made of silicon oxide treated with plasma nitriding processing.

According to the present invention, the switching element comprises an insulative substrate, a first electrode and a second electrode provided on one surface of the insulative substrate, and an interelectrode gap which is provided between the first electrode and the second electrode, and which has a gap on the order of nanometers in which switching phenomenon of resistance occurs by applying predetermined voltage between the first electrode and the second electrode. The one surface of the insulative substrate contains nitrogen, preferably is made of silicon oxide subjected to plasma nitriding processing.

That is, since in the switching element of the invention, the surface of the insulative substrate on which the interelectrode gap is formed contains nitrogen. Therefore, as compared with a switching element using an insulative substrate containing no nitrogen in its surface where an interelectrode gap is formed, the operating voltage can further be lowered.

BRIEF DESCRIPTION OF THE DRAWINGS

The present invention will become more fully understood from the detailed description given hereinbelow and the appended drawings which given by way of illustration only, and thus are not intended as a definition of the limits of the present invention, and wherein.

DETAILED DESCRIPTION OF PREFERRED EMBODIMENT

A specific embodiment of the present invention will be explained with reference to the drawings. However, the scope of the invention is not limited to the illustrated example.

<Structure of Switching Element>

A structure of a switching element 100 according to the present invention will be explained with reference to FIGS. 1 to 3.

Figure 1:
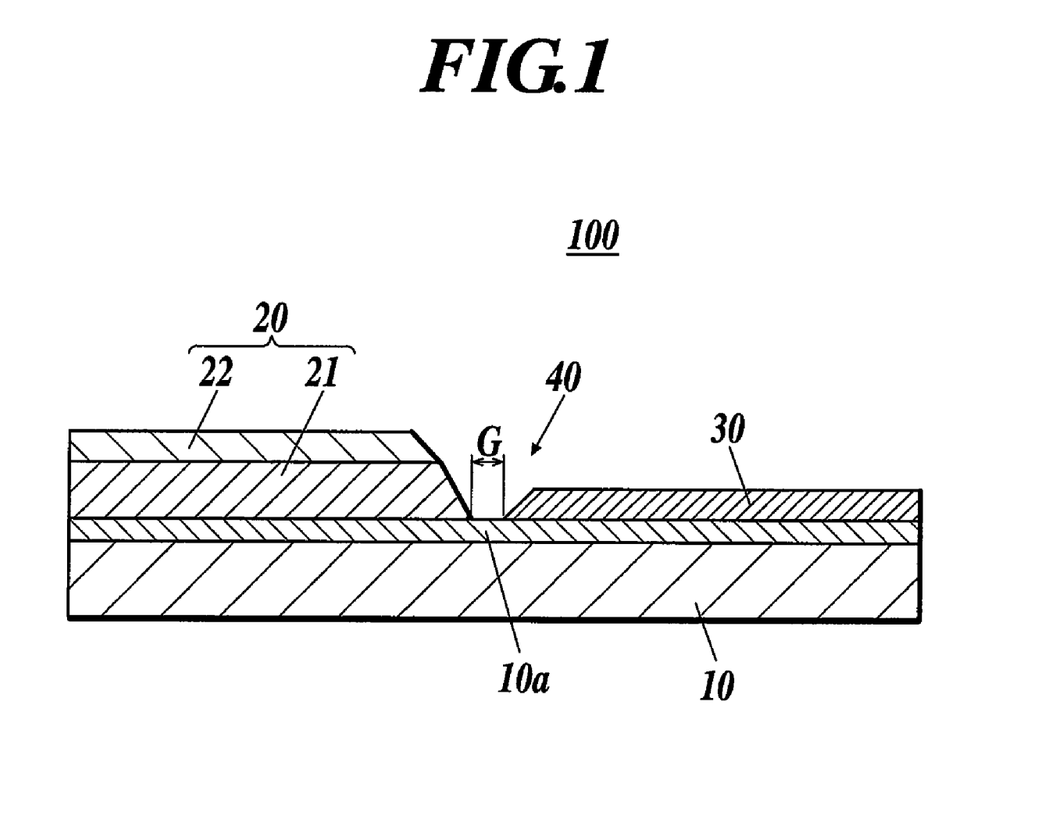
FIG. 1 is a schematic sectional view of an essential portion of a switching element according to an embodiment to which the present invention is applied.

As shown in FIG. 1, the switching element 100 includes an insulative substrate 10, a first electrode 20 and a second electrode 30 provided on an upper surface (one of surfaces) of the insulative substrate 10, and an interelectrode gap 40 provided between the first electrode 20 and the second electrode 30.

The insulative substrate 10 constitutes a support body for providing the two electrodes (first electrode 20 and second electrode 30) of the switching element 100 at a distance from each other.

One of surfaces of the insulative substrate 10 on which the first electrode 20 and the second electrode 30 are provided is a nitrogen-containing region 10a.

Specifically, the insulative substrate 10 is formed in such a manner that a predetermined substrate is subjected to predetermined nitriding processing and a nitrogen-containing region 10a is formed, or a predetermined substrate is formed with a silicon nitride film as the nitrogen-containing region 10a.

The predetermined substrate may be a silicon oxide ($SiO_2$) substrate, or a Si semiconductor substrate may be provided at its surface with an on oxide film such as silicon oxide.

The silicon nitride film is not limited only if the silicon nitride film is a silicon-based insulator including nitrogen, and examples of such material are $Si_xN_y$ and $Si_xO_yN_z$.

The predetermined nitriding processing is chemical nitriding processing such as CVD (Chemical Vapor Deposition), physical nitriding processing such as plasma nitriding processing, or film forming processing of nitrogen containing film by a sputtering method.

The structure of the insulative substrate 10 is not limited.

Specifically, the shape of a surface of the insulative substrate 10 may be a flat surface, or may have asperities.

The first electrode 20 pairs off with the second electrode 30, and carries out switching operation of the switching element 100.

The material of the first electrode 20 is not limited, and the shape may appropriately be changed, and preferable material is at least one selected from gold, silver, platinum, palladium, nickel, aluminum, cobalt, chromium, rhodium, copper, tungsten, tantalum, carbon and alloy thereof. Here, to enhance the adhesive with respect to the insulative substrate 10, two or more different metal layers may be superposed on each other. Specifically, the first electrode 20 may be of a laminated structure of chromium and gold.

Figure 2:
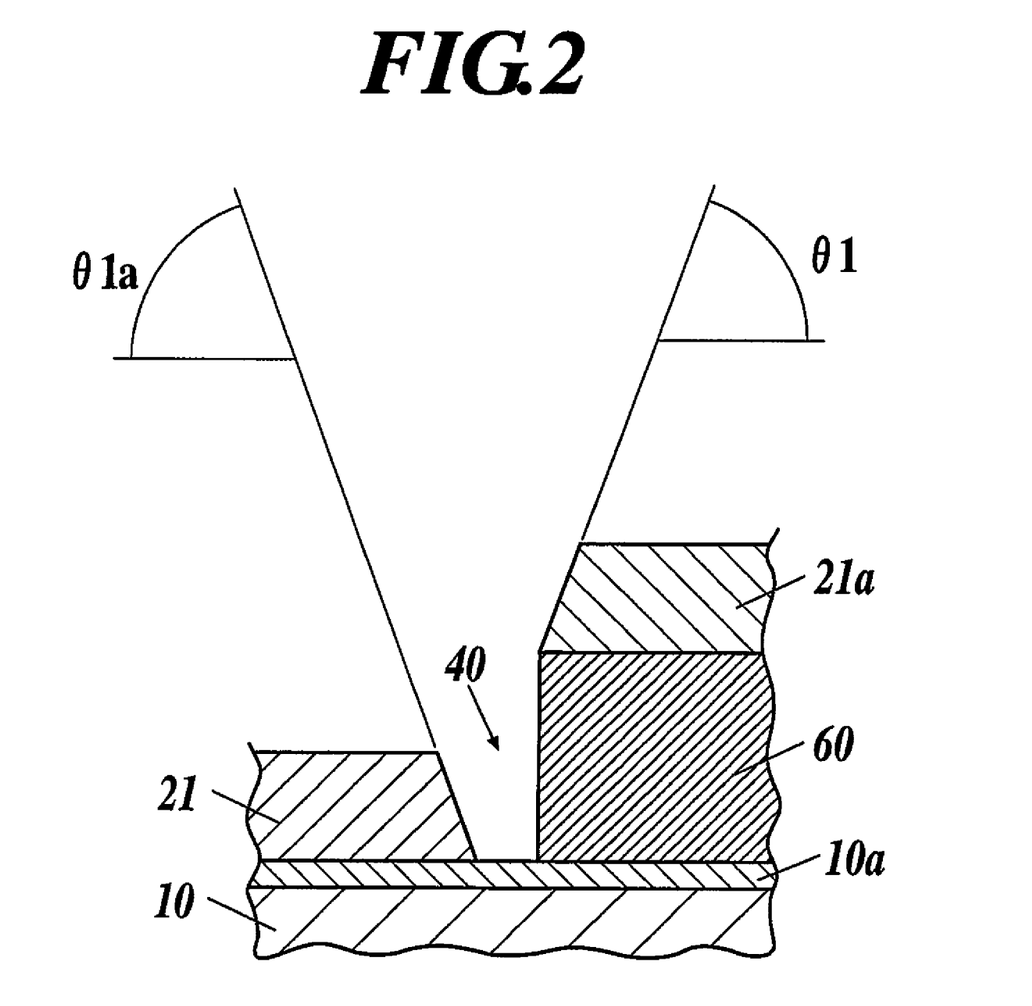
FIG. 2 is a schematic sectional view of a first evaporation step according to a producing step of the switching element.
Figure 3:
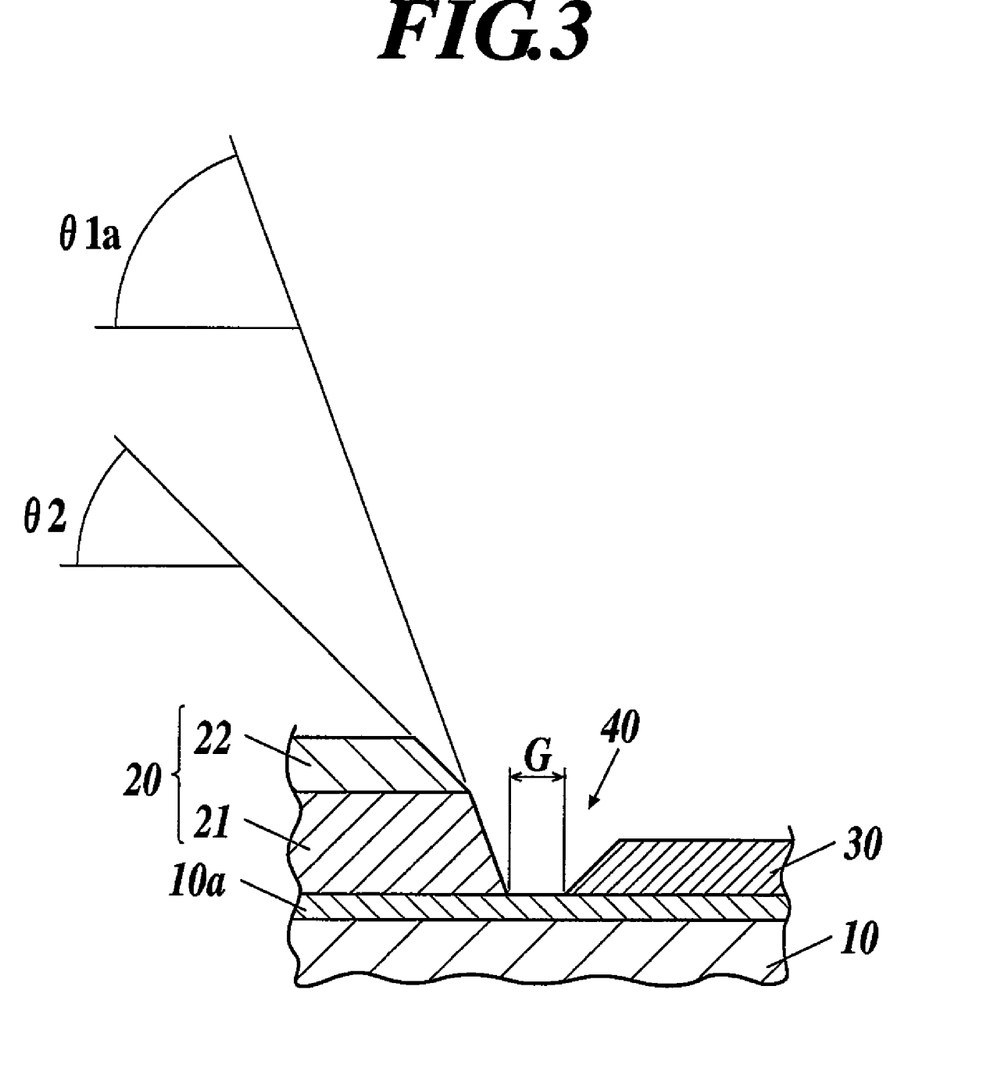
FIG. 3 is a schematic enlarged sectional view of an essential portion of the switching element shown in FIG. 1.

In FIGS. 1 to 3, the first electrode 20 is shown as a combination of a first electrode lower portion 21 and a first electrode upper portion 22 for the sake of convenience of explanation of later-described steps.

The second electrode 30 pairs off with the first electrode 20, and makes it possible to carry out the switching operation of the switching element 100.

The shape of the second electrode 30 is not limited, the shape may appropriately be changed, and preferable material is at least one selected from gold, silver, platinum, palladium, nickel, aluminum, cobalt, chromium, rhodium, copper, tungsten, tantalum, carbon and alloy thereof. Here, to enhance the adhesive with respect to the insulative substrate 10, two or more metal layers may be superposed on each other. Specifically, the second electrode 30 may be of a laminated (multilayer) structure of chromium and gold.

The interelectrode gap 40 has a gap on the order of nanometers between the first electrode 20 and the second electrode 30, and has a function for developing a switching phenomenon of the switching element 100.

A (interelectrode nanogap) distance (gap) G between the first electrode 20 and the second electrode 30 is preferably in a range of 0 nm$<$G$\leq$13 nm, and more preferably in a range of 0.8 nm$<$G$\leq$2.2 nm.

The reason why the upper limit value of the distance G is 13 nm is that when the switching element is by two times shadow evaporation operations, if the gap distance becomes greater than 13 nm, switching does not occur.

If the lower limit value of the distance G is 0 nm, this means that the first electrode 20 and the second electrode 30 are short-circuited. It is difficult to determine the lower limit value by measuring using a microscope, but the lower limit value can be the minimum distance at which tunnel current can be generated. That is, the lower limit value is a theoretical value of a distance at which current-voltage characteristics do not comply with Ohm's law and quantum-mechanical tunnel effect can be observed.

Here, if a resistance value is substituted into the theoretical equation of the tunnel current, a range of 0.8 nm$<$G$\leq$2.2 nm is obtained as a calculation result of the gap width.

The DC electric resistance of the interelectrode gap 40 (between the first electrode 20 and the second electrode 30) is preferably 1 k$\Omega$ or higher and less than 10 T$\Omega$, and more preferably greater than 100 k$\Omega$.

The reason why the upper limit value is 10 T$\Omega$ is that if the upper limit value exceeds 10 T$\Omega$, switching does not occur. The reason why the lower limit value is set to 1 k$\Omega$ is that the resistance has not yet become less than 1 k$\Omega$ for the present and thus, this value is set to the lower limit value.

If the element of the embodiment is conceived as a switch, since it is more preferable that the resistance is higher in the OFF state, it is preferable that the upper limit value is higher, but if the resistance in the ON state is 1 k$\Omega$, currents on the mA order easily flows and there is a possibility that other element is destroyed and thus, it is preferable that the lower limit value is about 100 k$\Omega$.

The closest portion between the first electrode 20 and the second electrode 30 may be formed at one or more regions where the first electrode 20 and the second electrode 30 are opposed to each other.

An island portion (middle ground portion) made of constituent material of the first electrode 20 and the second electrode 30 may be formed between the first electrode 20 and the second electrode 30. In this case, predetermined gaps are formed between the first electrode 20 and the island portion and between the second electrode 30 and the island portion, and the first electrode 20 and the second electrode 30 are not short-circuited.

Next, a producing method of the switching element 100 will be explained.

The switching element 100 is produced by carrying out (1) preparing step of insulative substrate 10, (2) first resist pattern forming step, (3) first evaporation step, (4) first lift OFF step, (5) second resist pattern forming step, (6) second evaporation step, (7) second lift OFF step and (8) field failure step.

(1) Preparing Step of the Insulative Substrate 10

A silicon oxide substrate formed with the nitrogen-containing region 10a, or a Si substrate having a silicon oxide film formed with the nitrogen-containing region 10a is used as the insulative substrate 10.

Concretely, a predetermined substrate such as the silicon oxide substrate or the Si substrate having the silicon oxide film is subjected to predetermined nitriding processing such as plasma nitriding processing to form the nitrogen-containing region 10a. The insulative substrate 10 is obtained by forming the silicon nitride film (nitrogen-containing region 10*a*) on a predetermined substrate such as the silicon oxide substrate or Si substrate having the silicon oxide film by a known method such as evaporation or sputtering.

(2) First Resist Pattern Forming Step

The first resist pattern forming step is carried out using a photolithography or the like, and a resist pattern 60 for forming the first electrode lower portion 21 is formed on the insulative substrate 10 (see FIG. 2).

The thickness of the resist pattern 60 may appropriately be changed. Specifically, the thickness is 1 μm.

(3) First Evaporation Step

The first evaporation step is carried out using a predetermined evaporation apparatus, and the first electrode lower portion 21 is formed.

An evaporation surface of the insulative substrate 10 is disposed such that it is inclined when an evaporation source faces the evaporation surface. That is, as shown in FIG. 2, when an angle formed between the evaporation surface and a direction in which evaporating particle flies from the evaporation source is defined as $\theta 1$, the insulative substrate 10 is disposed such that $0°<\theta 1<90°$ is established (the evaporation method will be referred to as "shadow evaporation", hereinafter). As a result, the first electrode lower portion 21 is formed into such a shape that its tip end is inclined with respect to the insulative substrate 10 (evaporation surface).

An angle $\theta 1a$ formed between the inclination direction of the tip end of the first electrode lower portion 21 and a surface of the insulative substrate 10 can be changed depending upon the shape of the resist pattern 60, characteristics metal deposited on the surface of the insulative substrate 10 and the value of the angle $\theta 1$.

In the first evaporation step, at least one material selected from gold, silver, platinum, palladium, nickel, aluminum, cobalt, chromium, rhodium, copper, tungsten, tantalum, carbon and alloy thereof is evaporated one or more times. More specifically, as two or more times evaporation operations, gold is evaporated after chromium is evaporated, and a first electrode lower portion 21 of two-layer structure may be formed.

The thickness of the first electrode lower portion 21 can be changed appropriately, and when gold is selected as the material, the thickness is 5 nm or more.

(4) First Lift OFF Step

The first lift OFF step is carried out using peel-off liquid which is suitable for material of the resist pattern 60. As a result of this step, a first electrode lower portion 21 is formed and a sacrificial electrode 21*a* formed on the resist pattern 60 is removed.

(5) Second Resist Pattern Forming Step

In the second resist pattern forming method, photolithography or the like is carried out, and a resist pattern (not shown) for forming the second electrode 30 and the first electrode upper portion 22 is formed.

(6) Second Evaporation Step

The second evaporation step is carried out using a predetermined evaporation apparatus, the second electrode 30 is formed, and the first electrode upper portion 22 is incidentally formed (see FIG. 3).

The second evaporation step is carried out using the shadow evaporation. As shown in FIG. 3 for example, when an angle formed between the evaporation surface and a flying direction of particles evaporated from the evaporation source is defined as $\theta 2$, the insulative substrate 10 is disposed such that $0°<\theta 2<\theta 1a<90°$ is established when $\theta 1a<90°$, and such that $0°<\theta 2<90°$ is established when $90°\leq \theta 1a$.

In the second evaporation step, at least one material selected from gold, silver, platinum, palladium, nickel, aluminum, cobalt, chromium, rhodium, copper, tungsten, tantalum, carbon and alloy thereof is evaporated one or more times.

By the second evaporation step, the interelectrode gap 40 having the gap on the order of nanometers is formed between the first electrode 20 and the second electrode 30.

That is, the interelectrode gap 40 is formed utilizing a shadow of the first electrode lower portion 21 formed by the evaporation particles in the shadow evaporation in the second evaporation step. Therefore, it is possible to obtain the interelectrode gap 40 having the predetermined interelectrode distance G by adjusting at least one of the thickness of the first electrode lower portion 21 and the angle $\theta 2$ of the shadow evaporation in the second evaporation step.

(7) Second Lift OFF Step

The second lift OFF step is carried out using peel-off liquid suitable for material of the resist pattern. As a result of this step, the first electrode 20 and the second electrode 30 are formed and the nanogap electrode can be obtained.

(8) Field Failure Step

Since nanogap electrodes are short-circuited in some cases, it is preferable that the field failure step is carried out if necessary.

In the field failure step, a variable resistor, a fixed resistor and a power supply (none of them are shown) are connected to the short-circuited electrode in series and voltage is applied. The resistance value of the variable resistor is adjusted such that resistance is slowly reduced from its initial value (resistance is high), and the voltage is stopped when current does not flow. With this, the nanogap electrode having a predetermined interelectrode distance G can be obtained.

The switching element 100 produced in this manner is sealed by a predetermined sealing member utilizing a predetermined hermetic sealing technique, and a switching device is formed.

In this switching device, lead wires are connected to the first electrode 20 and the second electrode 30, respectively, and the lead wires extend outside of the sealing member.

The above-described producing method of the switching element 100 is one example and the present invention is not limited to this.

EMBODIMENT

Characteristics of Switching Element

Next, characteristics of the switching element 100 according to the invention will be explained with reference to FIGS. 4 to 8.

First, efficiency of the nitrogen-containing region 10*a* possessed by the insulative substrate 10 will be explained with reference to FIG. 4.

Figure 4:
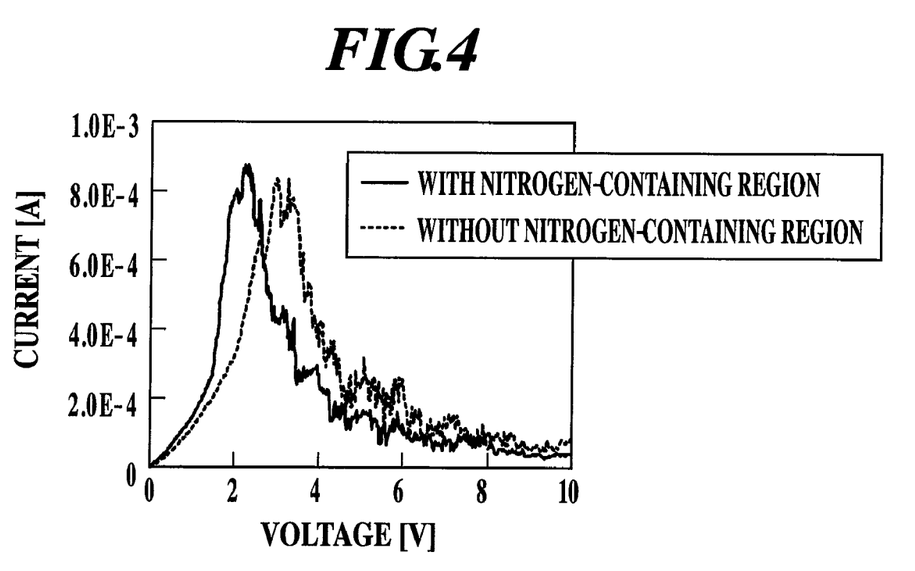
FIG. 4 is a diagram for explaining efficiency of a nitrogen-containing region possessed by an insulative substrate.

FIG. 4 shows a current-voltage curve between nanogap electrodes when voltage is applied to the interelectrode gap 40 (interelectrode nanogap). A horizontal axis shows voltage applied to the interelectrode nanogap, and a vertical axis shows current flowing through the interelectrode nanogap.

The solid line shows a result of measurement of the switching element 100 of the invention. As the insulative substrate 10, a silicon oxide substrate was subjected to plasma nitriding processing (nitrogen pressure: 0.25 mbar, plasma frequency: 2.45 GHz and processing time: 1 hour) to form the nitrogen-containing region 10*a*, and the substrate was used.

For comparison, a result of measurement of a switching element using a silicon oxide substrate formed with no nitrogen-containing region 10a as the insulative substrate is shown by a broken line. A structure of a switching element whose measurement result is shown with the broken line is different from the structure of the switching element 100 of the present invention only in that the insulative substrate 10 does not have the nitrogen-containing region 10a.

In FIG. 4, only positive voltage is shown, but in reality, the current-voltage curve is substantially symmetric with respect to a point 0, and voltage applied to the interelectrode nanogap or current flowing through the interelectrode nanogap does not depend on the polarity of the nanogap electrode. In the following explanation concerning FIG. 4, negative voltage is omitted.

That is, FIG. 4 shows the current-voltage curve in which voltage applied to the interelectrode nanogap is swept from 0V to 10V.

According to FIG. 4, it was found that in both the solid line and the broken line, if voltage to be applied was increased, flowing current was also increased, and if the voltage to be applied was further increased, the flowing current was reduced.

A voltage value at which a current value becomes maximum has a solid line of about 2.3 V and a broken line of about 3 V. Therefore, it was found that the switching element 100 of the invention (i.e., the switching element 100 using the silicon oxide substrate formed with the nitrogen-containing region 10a in the plasma nitriding processing as the insulative substrate 10) has lower operating voltage than that of the switching element using the silicon oxide substrate formed with not nitrogen-containing region 10a as the insulative substrate, and the nitrogen-containing region 10a was effective.

Next, electric characteristics of the switching element 100 of the invention will be explained with reference to FIGS. 5 to 7.

Figure 5A:
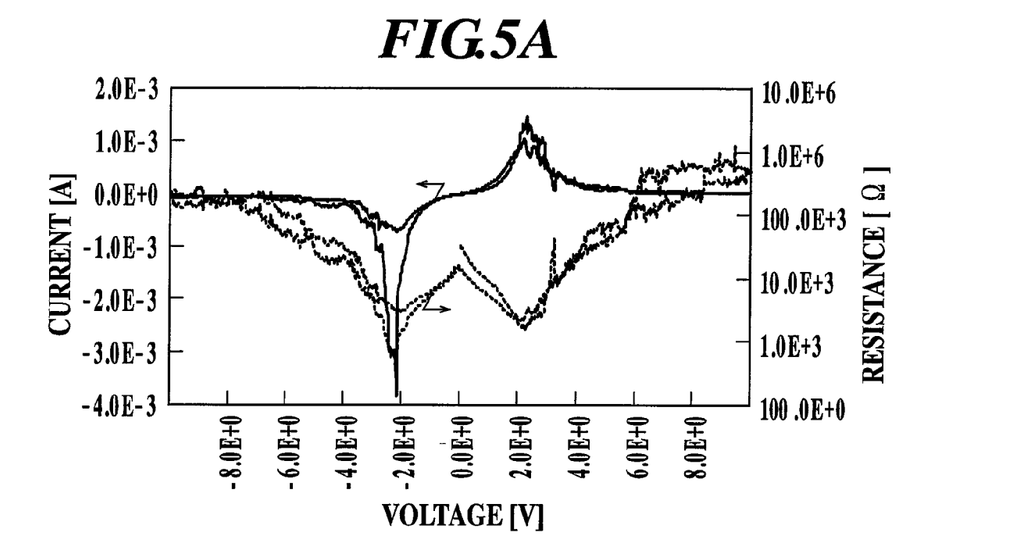
FIG. 5A is a diagram showing a current-voltage curve (solid line) and a resistance-voltage curve (broken line) and FIG. 5B is a diagram showing a distribution of voltages at resistance minimum values, of a switching element in which a silicon oxide substrate is subjected to plasma nitriding processing (nitrogen pressure: 0.25 mbar, plasma frequency: 2.45 GHz and processing time: 1 hour) and an nitrogen-containing region is formed as an insulative substrate.
Figure 5B:
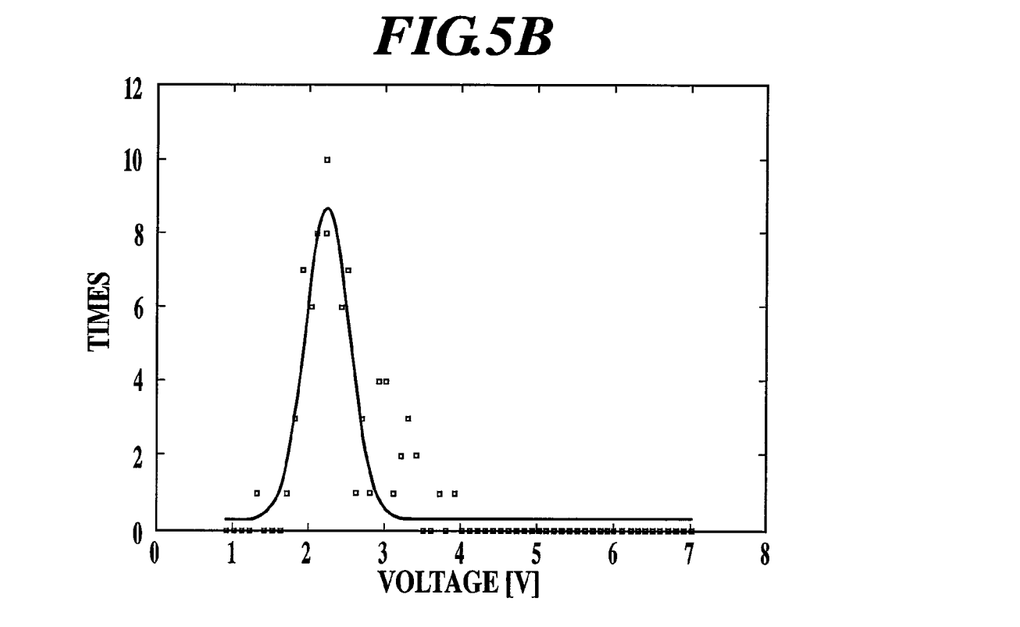

FIG. 5 show a result of measurement of the switching element 100 using, as the insulative substrate 10, a silicon oxide substrate subjected to plasma nitriding processing (nitrogen pressure: 0.25 mbar, plasma frequency: 2.45 GHz and processing time: 1 hour) and formed with the nitrogen-containing region 10a.

Figure 6A:
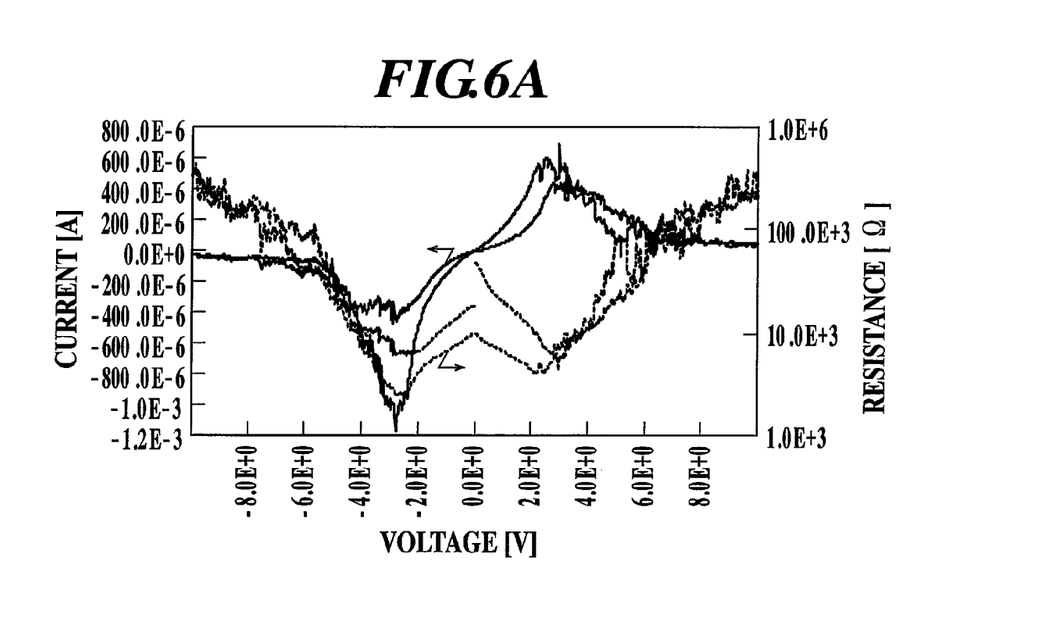
FIG. 6A is a diagram showing a current-voltage curve (solid line) and a resistance-voltage curve (broken line) and FIG. 6B is a diagram showing a distribution of voltages at resistance minimum values, of a switching element in which a silicon oxide substrate is subjected to plasma nitriding processing (nitrogen pressure: 1 mbar, plasma frequency: 2.45 GHz and processing time: 1 hour) and a nitrogen-containing region is formed as an insulative substrate.
Figure 6B:
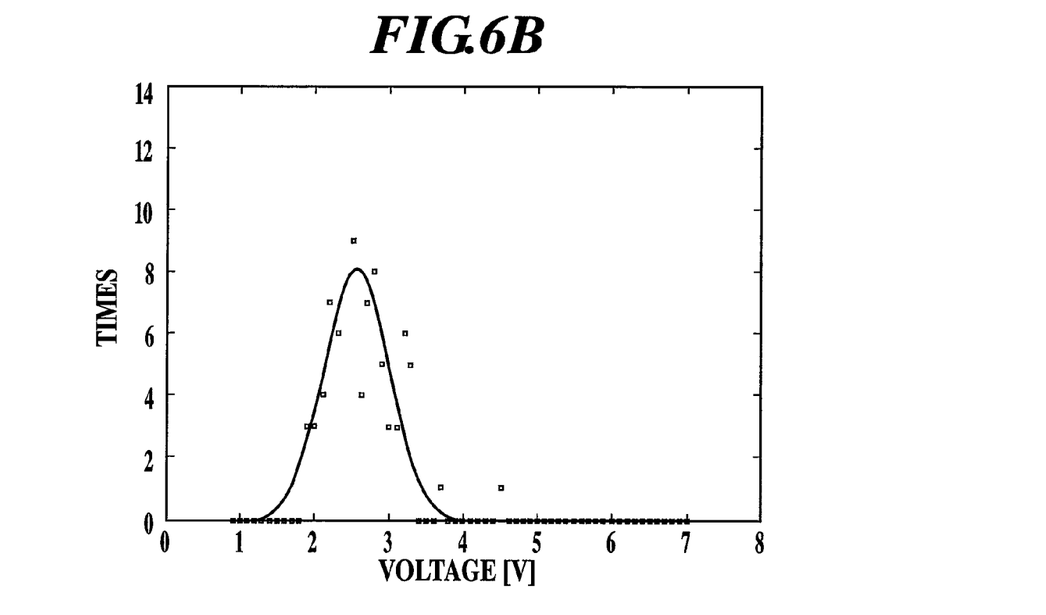

FIG. 6 show a result of measurement of the switching element 100 using, as the insulative substrate 10, a silicon oxide substrate subjected to plasma nitriding processing (nitrogen pressure: 1 mbar, plasma frequency: 2.45 GHz and processing time: 1 hour) and formed with the nitrogen-containing region 10a.

Figure 7A:
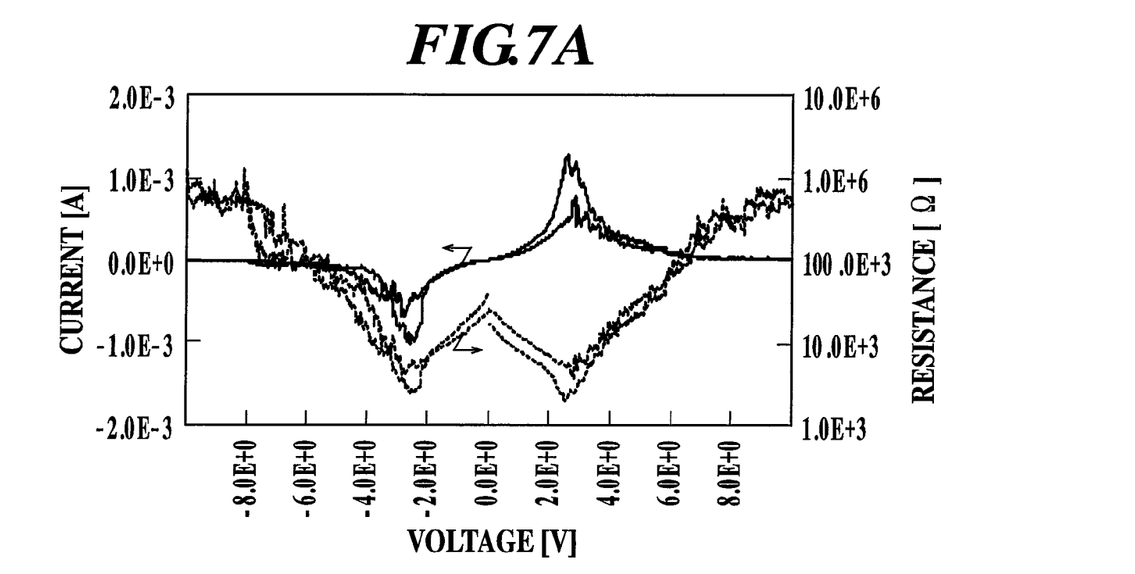
FIG. 7A is a diagram showing a current-voltage curve (solid line) and a resistance-voltage curve (broken line) and FIG. 7B is a diagram showing a distribution of voltages at resistance minimum values, of a switching element in which a silicon oxide substrate is subjected to plasma nitriding processing (nitrogen pressure: 1 mbar, plasma frequency: 2.45 GHz and processing time: 6 hour) and a nitrogen-containing region is formed as an insulative substrate.
Figure 7B:
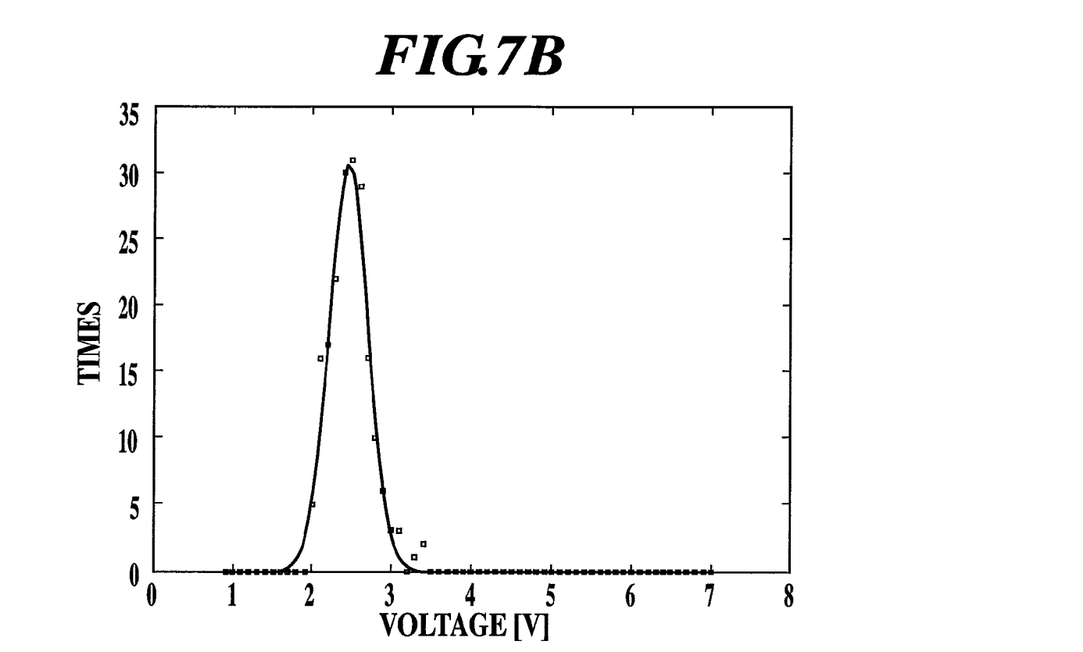

FIG. 7 show a result of measurement of the switching element 100 using, as the insulative substrate 10, a silicon oxide substrate subjected to plasma nitriding processing (nitrogen pressure: 1 mbar, plasma frequency: 2.45 GHz and processing time: 6 hour) and formed with the nitrogen-containing region 10a.

FIGS. 5A, 6A and 7A show current-voltage curves (solid lines) and resistance-voltage curves (broken lines) of interelectrode nanogap when voltage is applied to the interelectrode gap 40 (interelectrode nanogap). A horizontal axis shows voltage applied to the interelectrode nanogap, a left vertical axis shows current flowing through the interelectrode nanogap, and a right vertical axis shows resistance generated interelectrode nanogap.

In the result of measurement shown in FIGS. 5A, 6A and 7A, voltage applied to interelectrode nanogap was set to 0 V when the measurement was started, then, the voltage was swept to +10 V, then the voltage was swept to −10 V and then, the voltage was swept to 0 V.

FIGS. 5B, 6B and 7B show distribution of resistance minimum value obtained from a plurality of resistance-voltage curves obtained by repeatedly applying voltage to the interelectrode gap 40 (interelectrode nanogap). A horizontal axis shows a voltage value (absolute value) of voltage when the resistance minimum value is shown), and a vertical axis shows times showing the resistance minimum value by corresponding voltage value. Here, the resistance minimum value is a resistance value showing extremely small value in the resistance-voltage curve.

More specifically, if the resistance-voltage curve shown with the broken line in FIG. 5A is defined as one time resistance-voltage curve, FIG. 5B shows a distribution of the voltages at minimum resistance obtained from 80 times resistance-voltage curves obtained by repeatedly applying voltage to the interelectrode nanogap. For example, according to FIG. 5B, when the voltage is "3.0 V", the number of times is "four times". This indicates that when the voltage was "3.0 V", times showing the resistance minimum value was "four times" of 80 times.

Further, if the resistance-voltage curve shown with the broken line in FIG. 6A is one time resistance-voltage curve for example, FIG. 6B shows a distribution of the voltages at resistance minimum values obtained from 87 times resistance-voltage curves obtained by repeatedly applying voltage to interelectrode nanogap. For example, according to FIG. 6B, when the voltage is "3.0 V", the number of times is "three times". This indicates that when the voltage was "3.0 V", times showing the resistance minimum value was "three times" of 87 times.

Further, if the resistance-voltage curve shown with the broken line in FIG. 7A is one time resistance-voltage curve for example, FIG. 7B shows a distribution of the voltages at resistance minimum values obtained from 191 times resistance-voltage curves obtained by repeatedly applying voltage to interelectrode nanogap. For example, according to FIG. 7B, when the voltage is "3.0 V", the number of times is "three times". This indicates that when the voltage was "3.0 V", times showing the resistance minimum value was "three times" of 191 times.

According to the current-voltage curve (solid line) in FIG. 5A, it was found that a current value became maximum when voltage was about 2.2 V, and the current value becomes minimum when the voltage was about −2.1 V.

According to the resistance-voltage curve (broken line) in FIG. 5A, it was found that the resistance value was largely reduced when the current value in the current-voltage curve (solid line) was largely varied.

Voltage was repeatedly applied to the interelectrode nanogap and a plurality of current-voltage curves and resistance-voltage curves were obtained. As a result, it was found that the shapes of the curves had repeatability. That is, it was found that the switching operation could be stably repeated.

Figure 8:
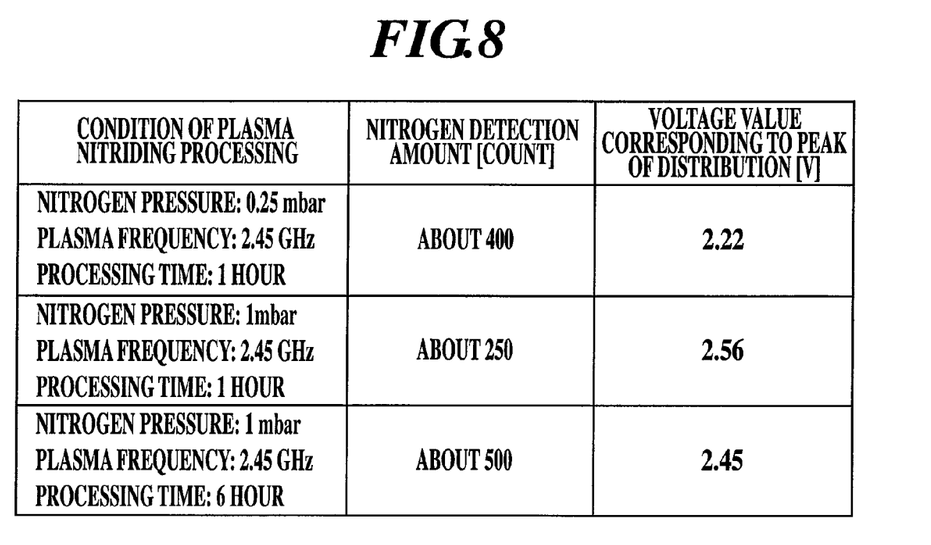
FIG. 8 is a diagram showing a relation between a condition of the plasma nitriding processing, a nitrogen detection amount by XPS and voltage value corresponding to a peak of distribution of the voltages at resistance minimum values.

According to the distribution of the voltages at resistance minimum values in FIG. 5B, it was found that a voltage value corresponding to the peak of the distribution was 2.22 V (see FIG. 8).

According to the current-voltage curve (solid line) in FIG. 6A, it was found that a current value became maximum when voltage was about 2.5 V, and the current value becomes minimum when the voltage was about −2.8 V.

According to the resistance-voltage curve (broken line) in FIG. 6A, it was found that the resistance value was largely reduced when the current value in the current-voltage curve (solid line) was largely varied.

Voltage was repeatedly applied to the interelectrode nanogap and a plurality of current-voltage curves and resistance-voltage curves were obtained. As a result, it was found that the shapes of the curves had repeatability. That is, it was found that the switching operation could be stably repeated.

According to the distribution of the voltages at resistance minimum values in FIG. 6B, it was found that a voltage value corresponding to the peak of the distribution was 2.56 V (see FIG. 8). According to the distribution of the voltages at resistance minimum values in FIG. 6B, it was found that the shape of the distribution was broad as compared with the distributions of the voltages at resistance minimum values in FIGS. 5B and 7B.

According to the current-voltage curve (solid line) in FIG. 7A, it was found that a current value became maximum when voltage was about 2.7 V, and the current value becomes minimum when the voltage was about −2.6 V.

According to the resistance-voltage curve (broken line) FIG. 7A, it was found that the resistance value was largely reduced when the current value in the current-voltage curve (solid line) was largely varied.

Voltage was repeatedly applied to the interelectrode nanogap and a plurality of current-voltage curves and resistance-voltage curves were obtained. As a result, it was found that the shapes of the curves had repeatability. That is, it was found that the switching operation could be stably repeated.

According to the distribution of the voltages at resistance minimum values in FIG. 7B, it was found that a voltage value corresponding to the peak of the distribution was 2.45 V (see FIG. 8).

That is, according to FIGS. 5 to 7, it was found that the switching element 100 using the silicon oxide substrate subjected to the plasma nitriding processing and formed with the nitrogen-containing region 10a as the insulative substrate 10 could stably repeat the switching operation.

Next, characteristics of the switching element 100 (switching element 100 using, as the insulative substrate 10, a silicon oxide substrate subjected to the plasma nitriding processing and formed with the nitrogen-containing region 10a) according to the present invention will be explained with reference to FIG. 8.

FIG. 8 shows a nitrogen detection amount by XPS (X-ray Photoelectron spectroscopy) and a voltage value corresponding to the peak of the distributions obtained from FIGS. 5B, 6B and 7B in association with conditions of the plasma nitriding processing.

According to the nitrogen detection amount shown in FIG. 8, it was found that if the silicon oxide substrate was subjected to the plasma nitriding processing, nitrogen was contained in the silicon oxide substrate. When the processing time is the same, it was found that if the nitrogen pressure was smaller, the nitrogen detection amount (nitrogen content) was greater, and when the nitrogen pressure was the same, the nitrogen detection amount (nitrogen content) was greater if the processing time was longer.

In a silicon oxide substrate which was not formed with the nitrogen-containing region 10a, nitrogen could not be detected by the XPS.

According to the voltage value corresponding to the peak of the distribution shown in FIG. 8, it was found that one having the plasma nitriding processing condition that nitrogen pressure was 0.25 mbar, plasma frequency was 2.45 GHz and processing time was 1 hour showed the minimum value, and one having the plasma nitriding processing condition that nitrogen pressure was 1 mbar, plasma frequency was 2.45 GHz and processing time was 1 hour showed the maximum value. With this, it was found that if the plasma nitriding processing condition was selected, the operating voltage of the switching element 100 could be controlled.

A voltage value corresponding to the peak of distribution of a switching element using a silicon oxide substrate formed with no nitrogen-containing region 10a as the insulative substrate was 2.6±0.1 V. Thus, it was found that the switching element 100 of the present invention (i.e., switching element 100 using, as the insulative substrate 10, the silicon oxide substrate subjected to the plasma nitriding processing and formed with the nitrogen-containing region 10a) had operating voltage lower than that of a switching element using, as the insulative substrate, a silicon oxide substrate formed with no nitrogen-containing region 10a, and the nitrogen-containing region 10a was effective.

A switching element 100 using, as the insulative substrate 10, a silicon oxide substrate formed with a silicon nitride film (nitrogen-containing region 10a) was also measured, and a current-voltage curve and a resistance-voltage curve of the interelectrode nanogap were obtained. A voltage value corresponding to the peak of the distribution of the resistance minimum value was obtained, and it was found that it was lower than the voltage value (2.6±0.1 V) of a switching element using, as the insulative substrate, a silicon oxide substrate formed with no nitrogen-containing region 10a. Therefore, it was found that the switching element 100 of the present invention (i.e., switching element 100 using, as the insulative substrate 10, the silicon oxide substrate formed with the silicon nitride film as the nitrogen-containing region 10a) had operating voltage lower than that of a switching element using, as the insulative substrate, a silicon oxide substrate formed with no nitrogen-containing region 10a, and the nitrogen-containing region 10a was effective.

The above-explained switching element 100 of the present invention includes the insulative substrate 10, the first electrode 20 and the second electrode 30 provided on one of surfaces of the insulative substrate 10, and the interelectrode gap 40 which is provided between the first electrode 20 and the second electrode 30 and which as a gap on the order of nanometers in which a resistance switching phenomenon occurs by applying predetermined voltage between the first electrode 20 and the second electrode 30, and the insulative substrate 10 is provided at its one surface with the nitrogen-containing region 10a containing nitrogen.

More specifically, as the insulative substrate 10, there are a substrate having the nitrogen-containing region 10a subjected to the plasma nitriding processing and made of silicon oxide, and a substrate made of silicon nitride.

That is, since nitrogen is included in a surface of the switching element 100 formed with the interelectrode gap 40 in the insulative substrate 10, it is possible lower the operating voltage as compared with a switching element using the insulative substrate having no nitrogen in its surface formed with the interelectrode gap 40 as shown in FIG. 4 for example.

With this, electric power can be saved, and compatibility with respect to silicon can be enhanced.

The present invention is not limited to the embodiment, and the invention can variously be modified and design may be changed within a range not departing from the subject matter of the invention.

Although the predetermined nitriding processing is the plasma nitriding processing in the above embodiment, kinds of the nitriding processing is not limited only if a predetermined substrate such as a silicon oxide substrate can be subjected to nitriding processing.

Although the first electrode 20 and the second electrode 30 are provided on the upper surface of the insulative substrate 10 in the embodiment, the invention is not limited to this only if at least the interelectrode gap 40 is provided on the nitrogen-containing region 10a. For example, the first electrode 20 and the second electrode 30 may be provided on a lower surface of the insulative substrate 10. Although the first electrode 20 and the second electrode 30 are arranged on the upper surface of the insulative substrate 10 in the lateral direction in the embodiment, the invention is not limited to this. It is only necessary that at least the interelectrode gap 40 is provided in the nitrogen-containing region 10a, and the first electrode 20 and the second electrode 30 may be arranged in the vertical direction for example.

Figure 9:
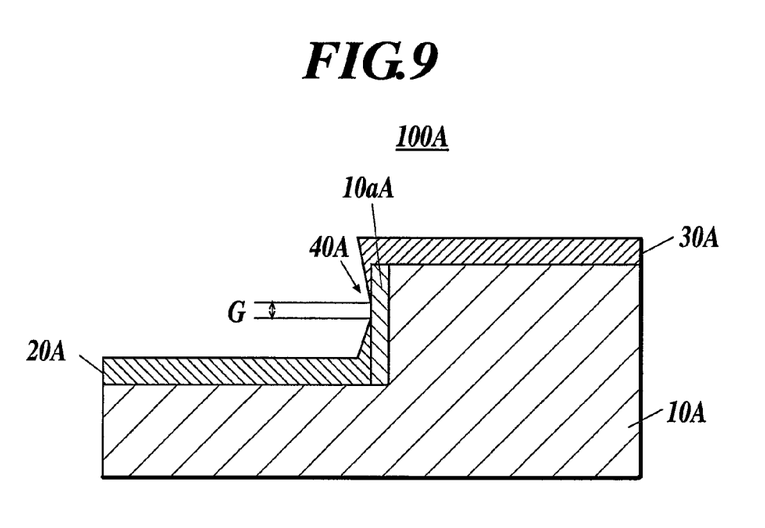
FIG. 9 is a schematic sectional view of an essential portion of the switching element according to a modification to which the invention is applied.

More specifically, as show in FIG. 9, a switching element 100A may include an insulative substrate 10A formed at its side surface with a nitrogen-containing region 10a A and having a projection, a first electrode 20A, a second electrode 30A provided above the first electrode 20A, and an interelectrode gap 40A provided between the first electrode 20A and the second electrode 30A. More specifically, according to the switching element 10A, the first electrode 20A is provided from an upper surface of the insulative substrate 10A which is not the projection to the side surface of the projection (nitrogen-containing region 10aA), the second electrode 30A is provided from the upper surface of the projection of the insulative substrate 10A to the side surface of the projection (nitrogen-containing region 10aA), and the interelectrode gap 40A is provided between the first electrode 20A and the second electrode 30A in the side surface of the projection formed with the nitrogen-containing region 10aA. In this case, it is only necessary to that at least the interelectrode gap 40A is provided in the nitrogen-containing region 10aA, and the nitrogen-containing region 10aA may be formed in a surface of the insulative substrate 10A which is in contact with a lower surface of the first electrode 20A or second electrode 30A. In this case, the projection of the insulative substrate 10A may be an insulator provided on the insulative substrate.

In addition, the above-described structures of the switching elements 100 and 100A and shapes of the various parts are only examples and the invention is not limited to those.

The entire disclosure of Japanese Patent Application No. 2007-165393 filed on Jun. 22, 2007, including description, claims, drawings and summary are incorporated herein by reference.

What is claimed is:

1. A switching element comprising:
an insulative substrate composed of a layer containing nitrogen as one surface of the insulative substrate and a layer not containing nitrogen;
a first electrode which is provided on the one surface of the insulative substrate, the first electrode being composed of a first electrode lower portion and a first electrode upper portion, one end surface of the first electrode lower portion being at a first predetermined angle with respect to the one surface of the insulative substrate, and the first electrode upper portion being laminated on the first electrode lower portion;
a second electrode which is provided on the one surface of the insulative substrate, one end surface of the second electrode on the first electrode side being at a second predetermined angle with respect to the one surface of the insulative substrate; and
an interelectrode gap which is provided between the first electrode and the second electrode, and which has a gap of nanometer order, wherein
the interelectrode gap includes a closest portion between the first electrode and the second electrode, the closest portion being a space between the first electrode and the second electrode, and the one surface of the insulative substrate being exposed in the space of the closest portion,
the one end surface of the first electrode lower portion is inclined with respect to the one surface of the insulative substrate at the first predetermined angle, which is less than 90 degrees,
an end surface of the first electrode upper portion is inclined with respect to the one surface of the insulative substrate at a third predetermined angle that is less than the first predetermined angle, and
the one end surface of the second electrode on the first electrode side is inclined with respect to the one surface of the insulative substrate at the second predetermined angle, which is less than 90 degrees.

2. The switching element according to claim 1, wherein the one surface of the insulative substrate is made of silicon oxide treated with predetermined nitriding processing.

3. The switching element according to claim 2, wherein the predetermined nitriding processing is plasma nitriding processing.

4. The switching element according to claim 1, wherein the one surface of the insulative substrate is made of silicon nitride.

5. The switching element according to claim 1, wherein a gap G of the interelectrode gap is in a range of $0 \text{ nm} < G \geqq 13 \text{ nm}$.

6. The switching element according to claim 1, wherein a DC electric resistance R of the interelectrode gap is in a range of $1 k\Omega \leqq R < 10 T\Omega$.

7. The switching element of claim 1, further comprising:
an electrode island portion disposed between the first and second electrodes,
wherein the interelectrode gap includes a first gap between the first electrode and the island portion and a second gap between the second electrode and the island portion.

8. A switching element comprising:
an insulative substrate composed of a layer containing nitrogen as one surface of the insulative substrate and a layer not containing nitrogen,
a first electrode which is provided on the one surface of the insulative substrate, the first electrode being composed of a first electrode lower portion and a first electrode upper portion, one end surface of the first electrode lower portion being at a first predetermined angle with respect to the one surface of the insulative substrate, and the first electrode upper portion being laminated on the first electrode lower portion;
a second electrode which is provided on the one surface of the insulative substrate, one end surface of the second electrode on the first electrode side being at a second predetermined angle with respect to the one surface of the insulative substrate; and
an interelectrode gap which is provided between the first electrode and the second electrode, and which has a gap of nanometer order, wherein
the one surface of the insulative substrate is made of silicon oxide treated with plasma nitriding processing, the interelectrode gap including a closest portion between the first electrode and the second electrode, the closest portion being a space between the first electrode and the second electrode, and the one surface of the insulative substrate being exposed in the closest portion,
the one end surface of the first electrode lower portion is inclined with respect to the one surface of the insulative substrate at the first predetermined angle, which is less than 90 degrees, an end surface of the first electrode upper portion is inclined with respect to the one surface of the insulative substrate at a third predetermined angle that is less than the first predetermined angle, and the one end surface of the second electrode on the first electrode side is inclined with respect to the one surface of the insulative substrate at the second predetermined angle, which is less than 90 degrees.

9. The switching element of claim 8, further comprising:
an electrode island portion disposed between the first and second electrodes,
wherein the interelectrode gap includes a first gap between the first electrode and the island portion and a second gap between the second electrode and the island portion.

* * * * *